United States Patent
Mehnert et al.

(10) Patent No.: US 8,717,827 B1
(45) Date of Patent: May 6, 2014

(54) METHOD FOR THE PERMANENTLY RELIABLE PROGRAMMING OF MULTILEVEL CELLS IN FLASH MEMORIES

(71) Applicant: Hyperstone GmbH, Constance (DE)

(72) Inventors: Axel Mehnert, Reichenau (DE); Franz Schmidberger, Constance (DE); Christoph Baumhof, Radolfzell (DE)

(73) Assignee: Hyperstone GmbH, Constance (DE)

( * ) Notice: Subject to any disclaimer, the term of this patent is extended or adjusted under 35 U.S.C. 154(b) by 0 days.

(21) Appl. No.: 13/774,484

(22) Filed: Feb. 22, 2013

(51) Int. Cl.
*G11C 11/34* (2006.01)

(52) U.S. Cl.
USPC ............ 365/185.33; 365/230.03; 365/185.11; 365/185.29; 365/218

(58) Field of Classification Search
USPC ............ 365/185.33, 230.03, 185.11, 185.29, 365/218
See application file for complete search history.

(56) References Cited

U.S. PATENT DOCUMENTS

| | | | |
|---|---|---|---|
| 2006/0245249 A1* | 11/2006 | Hwang | ............ 365/185.11 |
| 2010/0070688 A1 | 3/2010 | Lin | |
| 2012/0240012 A1 | 9/2012 | Weathers et al. | |

OTHER PUBLICATIONS

Takeuchi, K, "A Multiple Cell Architecture for High-Speed Programming Multilevel NAND Flash Memories", IEEE Journal of Solid-State Circuits, Aug. 1998, pp. 1228-1238, vol. 33, No. 8.

* cited by examiner

*Primary Examiner* — Jason Lappas
(74) *Attorney, Agent, or Firm* — Laurence A. Greenberg; Werner H. Stemer; Ralph E. Locher

(57) ABSTRACT

Data bits are programmed in cells of a flash memory which is divided into a multiplicity of separately erasable physical blocks, which are in turn split into individual physical pages to which the data bits can be written. The data bits are held in multilevel cells that store one lower bit and one upper bit per cell. The four states of which are distinguished by three voltage threshold values. The lower states are associated with the lower bit and the upper states are associated with the upper bit. The pages are distinguished by lower pages allocated to the lower bits, and upper pages allocated to the upper bits. Lower and upper pages which contain the same cells are combined by a pairing table to form paired pages. Reliable storage of data bits is achieved by programming paired pages with the same data bits and listing them as reliable paired pages in management data for the flash memory.

9 Claims, 3 Drawing Sheets

METHOD FOR THE PERMANENTLY RELIABLE PROGRAMMING OF MULTILEVEL CELLS IN FLASH MEMORIES

BACKGROUND OF THE INVENTION

Field of the Invention

The invention relates to a method for programming data bits in cells of a flash memory which is divided into a multiplicity of separately erasable physical blocks, the physical blocks in turn being split into individual physical pages to which the data bits can be written. The data bits are held in multilevel cells which can be used to store one lower bit and one upper bit per cell, the four states of which are distinguished by three voltage threshold values, and the lower states are associated with the lower bit and the upper states are associated with the upper bit. The pages are distinguished by lower pages, which are allocated to the lower bits, and upper pages, which are allocated to the upper bits. Lower pages and upper pages which contain the same cells are combined by means of a pairing table to form paired pages.

The development of flash memories has resulted in chips having ever greater storage capacities. These have been achieved through the further development of single-level cells (SLC) to form so-called multilevel cells (MLC), in which two or more bits per memory cell are stored in multiple levels. These chips are organized in separately erasable blocks and individually writable pages. The pages are usually organized such that they combine bits from one particular level. In such chips, the lower pages (LSB page) have a high write speed and the upper pages (MSB pages) are much slower to write. Thus, in multilevel chips having pages of 4 kBytes in size, the fast pages can be written within 300 µs while the slow pages require up to 1500 µs for writing.

The MLC blocks in a memory are erased in similar fashion to SLC blocks. The article by Ken Takeuchi et. al, "A Multipage Cell Architecture for High-Speed Programming Multilevel NAND Flash Memories", IEEE JOURNAL OF SOLID-STATE CIRCUITS, Vol. 33, No. 8, August 1998, proposes programming a two-level MLC memory by programming the bits of the lower level from the erased state while the bits of the upper level are written to cells which are preprogrammed as early as during the programming of the lower level. The two pages connected to one another in this manner are called "paired pages". They are normally not logically combined, however.

Voltage threshold values differentiate between the charge states of a cell. Three threshold values can be used to ascertain four states of a cell, which represent the associated logic content of the cell as bit values of two bits. These two bits are respectively associated with one page from the paired pages. The error interval is then given by the interval of the voltage threshold values. If more charge than necessary is then channeled through to a cell by the programming, the interval from the next highest threshold value becomes smaller and the bit value can be interpreted incorrectly.

Electron migration means that the charge can be reduced and the interval from the next lowest threshold value can decrease. This likewise means that the bit value can be interpreted incorrectly.

The error interval in any direction corresponds to half the interval of the threshold values.

The quality of a cell in a flash memory is determined primarily by the number of write and erase cycles. The stability of the voltage values and hence of the bit values of a cell can become impaired over time.

The datasheets of flash memories specify data retention of approximately 10 years, while the data retention that can actually be achieved is dependent on many external factors, such as heat, magnetism, reading/writing of neighboring cells and other factors. The error interval is a crucial factor for the stability of the data retention. The greater error interval, which is determined by the number of electrons or the charge which need to be moved, the better data retention of a cell. In an SLC block, the intervals of the threshold values are much greater than in an MLC block, since only two voltage values are distinguished, of course. Therefore, the data retention in an SLC block is also much more stable and more persistent than in an MLC block.

Patent application publication US 2010/0070688 A1 proposes constructing a flash memory from SLC and MLC memory chips and storing the important data, such as management data for the memory, in the SLC area. These cells are more durable and allow higher read and write speeds.

One problem of a two-level MLC memory is that programming pages on the upper level can destroy data on the lower level which have already been written correctly beforehand. These correct data on the lower level are then normally no longer available for a check. They could be kept redundantly, but this is impractical.

This problem is particularly serious when management data for a flash memory, such as mapping tables, are affected. The problem is also very significant in the event of power outages with short down times.

MLC memory chips are offered on the market at low cost. For the same memory sizes, they are more than half as cheap as memory chips in SLC technology. Therefore, it is also possible to operate an MLC block in a flash memory in an SLC mode with only one bit value per cell, in which case the costs remain below those for an SLC block.

Patent application publication US 2012/0240012 A1 proposes operating MLC memory blocks which exceed a particular error rate in an SLC mode. In this case, only the bits on the lower level are then used for these memory blocks. The bits on the upper level remain unused. Since the blocks already have an increased error rate in the SLC mode, no real durability can be achieved. A fundamental disadvantage of this method is also that any change in the mode of operation of a block prompts a decrease in the gross capacity of the memory and hence all the remaining blocks are subject to greater wear, which results in an impact which is counter to the desired effect.

SUMMARY OF THE INVENTION

It is accordingly an object of the invention to provide a method for permanently reliable programming of multi-level cells in flash memories which overcomes the above-mentioned disadvantages of the heretofore-known devices and methods of this general type and which provides for a method for programming large low-cost MLC memory chips which keeps the useful data in the flash memory with values for the durability of a memory comprising SLC memory chips.

With the foregoing and other objects in view there is provided, in accordance with the invention, a method of programming data bits in cells of a flash memory, which comprises:

providing a flash memory divided into a multiplicity of separately erasable physical blocks, the physical blocks in turn being split into individual physical pages to which the data bits can be written;

holding the data bits in multilevel cells that can be used to store one lower bit and one upper bit per cell, the cell having four states that are distinguished by three voltage threshold values, and the lower states are associated with the lower bit and the upper states are associated with the upper bit, and wherein the pages are distinguished by lower pages allocated to the lower bits, and upper pages allocated to the upper bits, and wherein lower pages and upper pages containing the same cells are combined by way of a pairing table to form paired pages; and programming paired pages with the same data bits and listing the paired pages as reliable paired pages in management data for the flash memory to thereby assure reliable storage of data bits.

In other words, the objects of the invention are achieved with a method for programming data bits in cells of a flash memory having multilevel cells which is divided into a multiplicity of separately erasable physical blocks (B1-Bm), the physical blocks in turn being split into individual pages (P1-Pn) to which the data bits can be written. Each cell can be used to store two data bits as one lower bit and one upper bit, the four states of which are distinguished by three voltage threshold values. In this case, the lower states are associated with the lower bit and the upper states are associated with the upper bit. The pages are distinguished by lower pages, which are allocated to the lower bits, and upper pages, which are allocated to the upper bits. Lower pages and upper pages which contain the same cells are combined by means of a pairing table to form paired pages.

The method is distinguished in that reliable storage of data bits is achieved by programming paired pages with the same data bits and listing them as reliable paired pages in management data for the flash memory. The double programming of the data bits in two pages of an MLC flash memory achieves increased durability for the stored information which exceeds the durability of SLC memories using the same technology. The double programming channels an additional charge to the cell, and the error interval is increased in size. The incremental programming in MLC technology means that the effect of wear is smaller than in the case of SLC technology. However, the programming in MLC technology is slower than SLC technology.

The method can be performed in a first embodiment using known programming steps, since the data bits are first of all programmed into a lower page of the physical block and are then copied to the paired upper page. For this type of programming, an energy store, for example a capacitor of sufficient size, can be provided for the case of a power outage, with the energy store being able to be used to span the necessary period of time for programming the upper page.

In a second advantageous embodiment of the method, the data bits are first of all written to lower pages of a buffer block and, as soon as this buffer block is full, these lower pages of the buffer block are successively copied to the lower pages of a destination block. Next, the same pages from the buffer block are once again programmed into the paired upper pages of the destination block. This can be done strictly according to page numbers in sequentially rising order while observing a programming specification. Only when the complete programming operation for both pages has been concluded is the destination block entered as valid into the management data of the flash memory. Previously, the content of the buffer block is regarded as valid. This method therefore ensures that, in the event of a power outage while the upper page is programmed, the content of the lower page is not destroyed.

The validity annotation in the management data is then used to clear the buffer block again for erasure. In this embodiment of the method, an energy store is not necessary.

If a host system sends an end command to the flash memory for the writing of pages, the content of buffer blocks which are not yet completely full is transferred to destination blocks on the basis of the method described above, and the buffer blocks are cleared again.

A reliably paired memory page is read by first of all reading only the lower page. The bit value "0" is recognized so long as the voltage value read from the cell is between the second and third voltage threshold values. If too much charge has been channeled into the cell during programming and the third voltage threshold value has been exceeded, the reading of the upper page continues to deliver the correct result.

If the charge has fallen below the second threshold value, the bit value "0" continues to be recognized. Only when the charge has fallen below the first threshold value is an error recognized.

Read errors which occur are rectified by an error correction unit. If the error correction unit is unable to rectify read errors which occur, the upper page is read.

In a background routine, both sides of a reliably paired page can be read and compared. When a particular number of errors is exceeded, both pages can be reprogrammed.

The method described here for reliably paired pages can be used for the whole MLC flash memory but also just for a subset of the physical blocks within a flash memory. Hence, it can be used just for the firmware or for metadata, for example. The method is therefore far more flexible than the known methods in the prior art.

Other features which are considered as characteristic for the invention are set forth in the appended claims.

Although the invention is illustrated and described herein as embodied in a method for the permanently reliable programming of multilevel cells in flash memories, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DETAILED DESCRIPTION OF THE INVENTION

Figure 1:
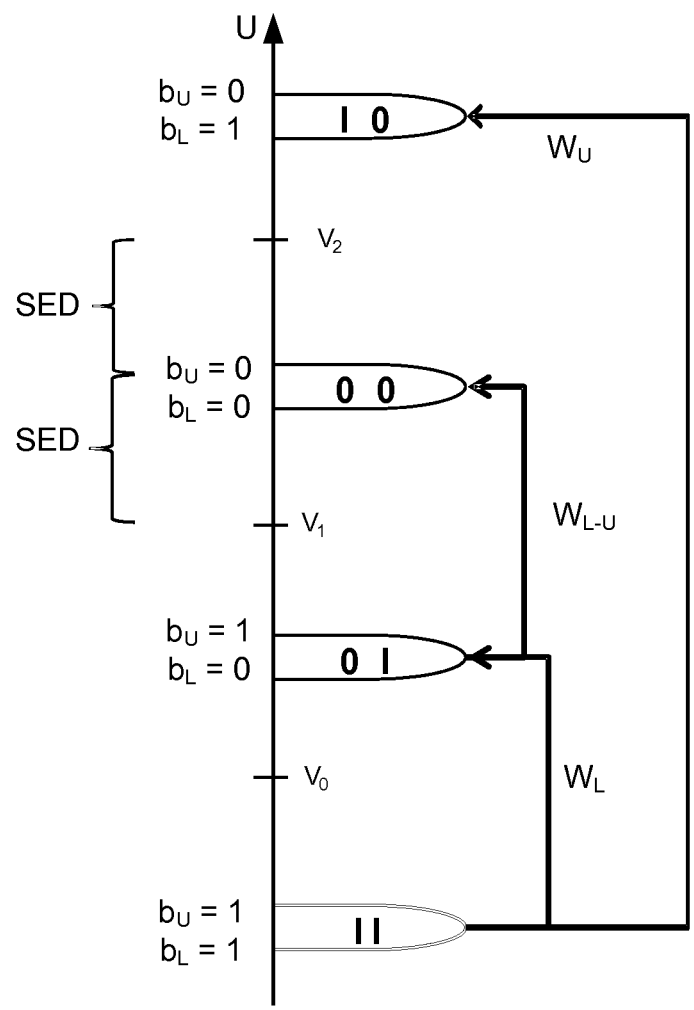
FIG. 1 shows the voltage circumstances in an MLC page for 2 bits.

Referring now to the figures of the drawing in detail and first, particularly, to FIG. 1 thereof, there is shown the voltages U for a normal MLC cell. In the erased state "11", the cell is on a lowest voltage level. The lower bit $b_L$ has the bit value "1", as does the upper bit $b_u$. A write operation $W_L$ for the lower bit $b_L$ channels so much charge into the cell that the first voltage threshold value $V_0$ is exceeded and the lower bit $b_L$ assumes the bit value "0". The bit value for the upper bit $b_u$ continues to remain at "1".

A further programming operation $W_{L-U}$ channels further charge into the cell and exceeds the voltage threshold value $V_1$. The lower bit $b_L$ remains at the bit value "0". The bit value for the upper bit $b_U$ changes to "0".

The MLC technology only allows the state "10" above the voltage threshold value $V_2$ to be reached from the erased state "II" by means of the programming operation $W_U$.

Between the states of the cell and the voltage threshold values, the standard error interval SED is obtained.

Figure 2:
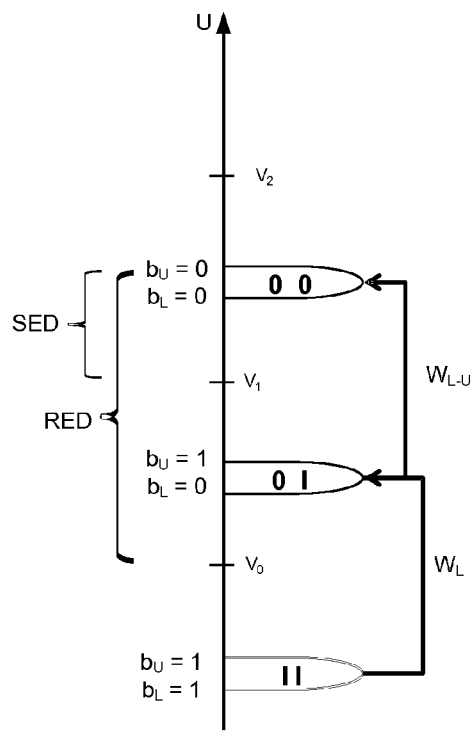
FIG. 2 shows the voltage circumstances in an MLC page for 2 bits in the case of admissibly paired pages.

FIG. 2 shows the voltage circumstances U for an MLC cell in the case of a reliably paired page. In the erased state "II", the cell is on a lowest voltage level. The lower bit $b_L$ has the bit value "1", as does the upper bit $b_U$. A write operation $W_L$ for the lower bit $b_L$ channels so much charge into the cell that the first voltage threshold value $V_0$ is exceeded and the lower bit $b_L$ assumes the bit value "0". The bit value for the upper bit $b_U$ continues to remain at "1".

A further programming operation $W_{L-U}$ for the paired page channels further charge into the cell and exceeds the voltage threshold value V1. The lower bit $b_L$ remains at the bit value "0". The bit value for the upper bit $b_U$ changes to "0". Both bit values on both pages are therefore the same and deliver the same value during reading.

The state "I0" above the voltage threshold value $V_2$ is not used. Since this state causes the greatest wear on the cell but does not need to be used, this achieves a positive effect with regard to the reliability of the data storage.

The standard error interval SED is now replaced by the error interval RED for reliable cells. It has become very much greater.

Figure 3:
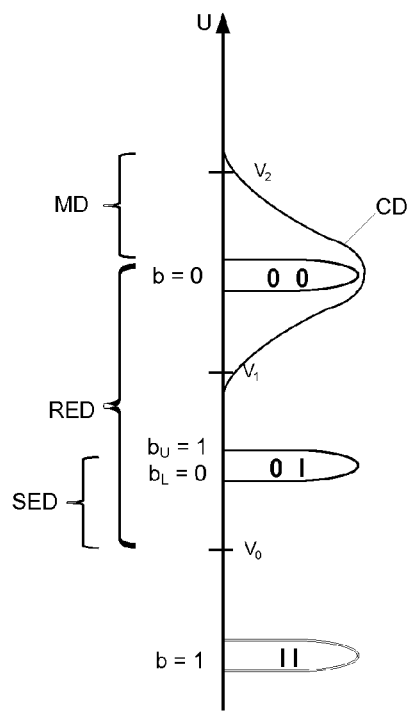
FIG. 3 shows the voltage circumstances when an admissibly paired page is read.

FIG. 3 shows the voltage circumstances for a cell as shown in FIG. 2 in a case of migrating charges CD for the state "00". The voltage distribution can widen and can exceed the voltage threshold values $V_1$ and $V_2$. The error interval RED also covers a drop below the threshold $V_1$. The exceeding of the threshold $V_2$ is at the same time covered by the additional error interval MD. Overall, it can be seen that even with relatively great migration of the charges in a cell it is possible to read the content reliably.

Figure 4:
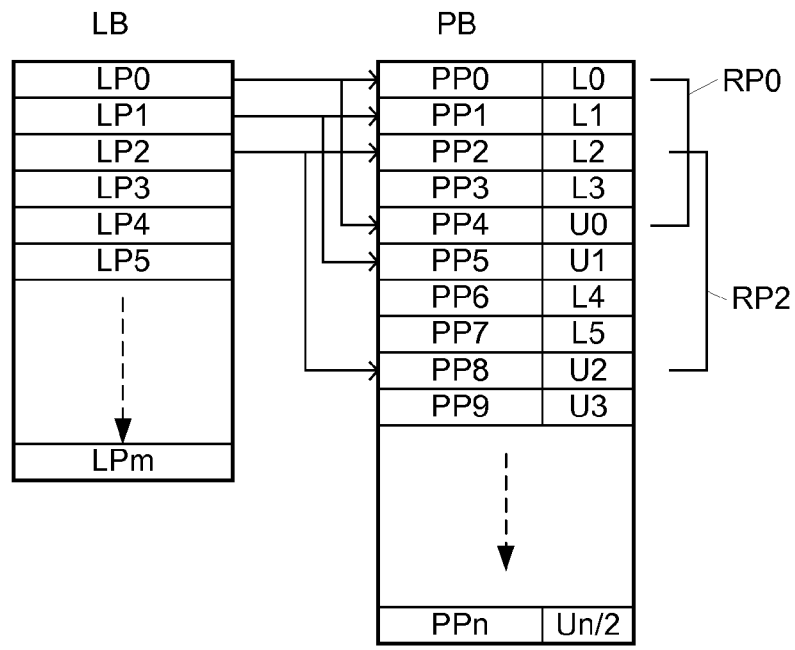
FIG. 4 shows the association between logical pages and paired physical pages.

FIG. 4 shows the association between logical pages LPk in a logical block LB and paired pages PPx in a physical block PB. Typical physical blocks PB are designed such that first of all four lower pages $L_0$-$L_3$ are present, which are then joined by two upper pages Ux and two lower pages Lx. Lower pages Lx are paired with upper pages Ux having the same sequence number x. If they are programmed with the same content for the logical pages LPk (k may be unequal to x), the reliably paired pages RPk are obtained. In this case, the reliably paired pages RP0 and RP2 are marked.

Figure 5:
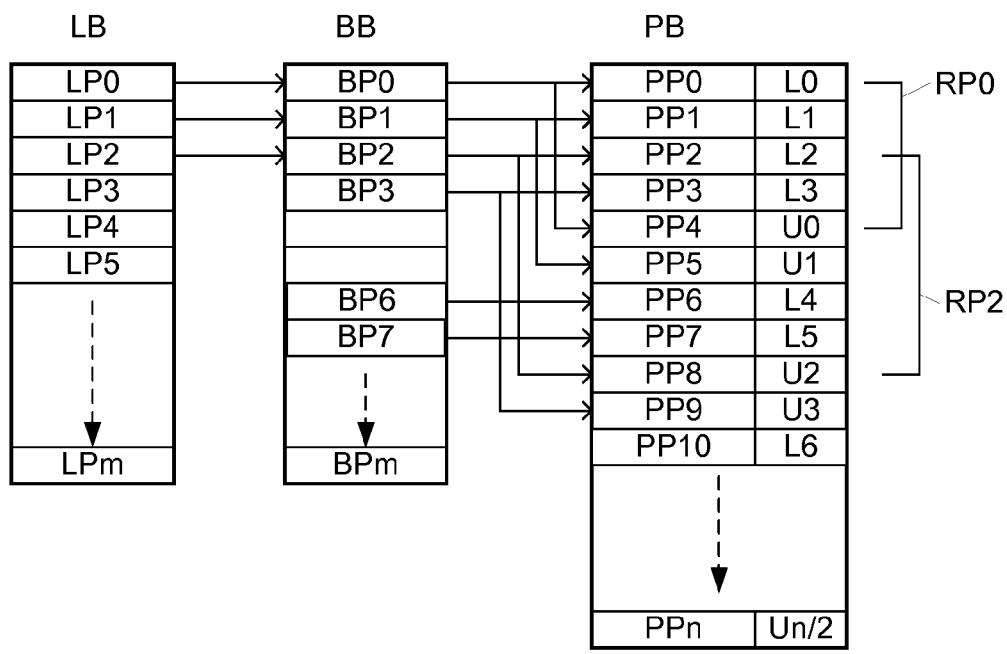
FIG. 5 shows the use of the buffer block.

FIG. 5 shows the same circumstances as in FIG. 4, the only difference being that additionally the buffer block BB is present, to which the pages BPx are written first of all.

As soon as the buffer block BB is full, the pages are transferred from the buffer block BB to the physical block PB on the basis of the method described for FIG. 3.

The following lists the reference symbols used in the above description and illustrated in the drawing:
BB Buffer block
BPn Page n of the buffer block
CD Distribution of the charge from the upper level
bn Bit of the reliably paired page
$b_L$ Lower bit
$b_U$ Upper bit
Ln Page n of the lower level
LB Logical block
LPm Logical page m
MD Margin of the error interval
PB Physical block
PPn Physical page n
RED Error interval for reliable cells
RPn Reliably paired page n
SED Standard error interval
U Potential on the memory cell
Un Page of the upper level
$V_0$-$V_2$ Threshold values
$W_U$ Programming of the upper bits
$W_L$ Programming of the lower bits
$W_{L-U}$ Programming of the upper bits after the lower bits

The invention claimed is:

1. A method of programming data bits in cells of a flash memory, which comprises:
   providing a flash memory divided into a multiplicity of separately erasable physical blocks, the physical blocks in turn being split into individual physical pages to which the data bits can be written;
   holding the data bits in multilevel cells that can be used to store one lower bit and one upper bit per cell, the cell having four states that are distinguished by three voltage threshold values, and the lower states are associated with the lower bit and the upper states are associated with the upper bit, and wherein the pages are distinguished by lower pages allocated to the lower bits, and upper pages allocated to the upper bits, and wherein lower pages and upper pages containing the same cells are combined by way of a pairing table to form paired pages; and
   programming paired pages with the same data bits and listing the paired pages as reliable paired pages in management data for the flash memory to thereby assure reliable storage of data bits.

2. The method according to claim 1, which comprises first programming the data bits into a lower page and subsequently copying the data bits to the paired upper page.

3. The method according to claim 2, which comprises first writing the data bits to lower pages of a given buffer block and, as soon as the given buffer block is full, successively copying the lower pages of the given buffer block to the lower pages of a destination block and programming the same pages once again into the paired upper pages of the destination block.

4. The method according to claim 3, which comprises, following a complete programming of the destination block, recording the destination block as valid in the management data of the flash memory and clearing the given buffer block for erasure.

5. The method according to claim 3, wherein an end command prompts unfilled buffer blocks to be transferred to a destination block and the buffer block to be cleared for erasure.

6. The method according to claim 1, which comprises reading a reliably paired memory page by first reading only the lower page and, if an error correction unit is unable to rectify read errors in the event that read errors occur, reading the upper page.

7. The method according to claim 6, which comprises, if read errors occur, rewriting the reliably paired pages.

8. The method according to claim 1, wherein only one area of the flash memory has the pages operated as reliably paired pages.

9. A flash memory with MLC cells, comprising at least one area of the flash memory having pages programmed therein as reliably paired pages in accordance with the method of claim 1.

* * * * *